(12) United States Patent  
Yadav

(10) Patent No.: US 9,129,607 B2
(45) Date of Patent: Sep. 8, 2015

(54) METHOD AND APPARATUS FOR COMBINING DIGITAL SIGNALS

(75) Inventor: Pankaj Yadav, Rewari (IN)

(73) Assignee: ADOBE SYSTEMS INCORPORATED, San Jose, CA (US)

( * ) Notice: Subject to any disclaimer, the term of this patent is extended or adjusted under 35 U.S.C. 154(b) by 338 days.

(21) Appl. No.: 13/170,768

(22) Filed: Jun. 28, 2011

(65) Prior Publication Data

US 2015/0199976 A1   Jul. 16, 2015

(51) Int. Cl.
*H04J 3/02* (2006.01)
*G10L 21/02* (2013.01)
*H04L 25/49* (2006.01)
*H04M 3/56* (2006.01)
*H04L 12/16* (2006.01)
*H04Q 11/00* (2006.01)
*H04J 3/18* (2006.01)

(52) U.S. Cl.
CPC ........ *G10L 21/0202* (2013.01); *H04L 25/4927* (2013.01); *H04M 3/568* (2013.01)

(58) Field of Classification Search
USPC ........... 370/537, 267, 268, 477; 375/316, 317
See application file for complete search history.

(56) References Cited

U.S. PATENT DOCUMENTS

| | | | |
|---|---|---|---|
| 3,805,191 A * | 4/1974 | Kawai et al. | 332/145 |
| 4,809,262 A * | 2/1989 | Klose et al. | 370/268 |
| 6,496,548 B1 * | 12/2002 | Schneider et al. | 375/317 |
| 7,006,616 B1 | 2/2006 | Christofferson et al. | |
| 7,567,270 B2 | 7/2009 | Chapweske et al. | |
| 2006/0287744 A1 | 12/2006 | Kim et al. | |
| 2007/0140499 A1 | 6/2007 | Davis | |

* cited by examiner

*Primary Examiner* — Wutchung Chu
*Assistant Examiner* — Stephanie Chang
(74) *Attorney, Agent, or Firm* — Keller Jolley Preece

(57) ABSTRACT

A method and apparatus for combining digital signals. In one embodiment, a computer implemented method and an apparatus implementing the method combines a plurality of digital signals. The method determines, within a sample set of the plurality of digital signals, a maximum positive integer value and a maximum negative integer value. The method adds the maximum positive integer value to the maximum negative integer value to form an output value representing a combination of the plurality of digital signals within the sample set. The method repeats the foregoing steps for each additional sample set of digital signals.

20 Claims, 5 Drawing Sheets

METHOD AND APPARATUS FOR COMBINING DIGITAL SIGNALS

BACKGROUND

1. Field

Embodiments of the present invention generally relate to signal processing and, more particularly, to a method and apparatus for combining digital signals.

2. Description of the Related Art

In modern communications systems, digital signal processing is used. Such processing may require a plurality of digital signals to be combined to form a composite signal. For example, audio signals are typically encoded as pulse code modulation (PCM) signals, where a signal is represented as a sequence of integer values. Audio signal combination (mixing) is used to combine multiple live or recorded channels of audio signals to produce a single channel. There are many scenarios in which audio mixing is needed, for example, in telephonic conferencing, Voice over Internet Protocol (VoIP) conferencing, video conferencing, and the like, where multiple participants may be speaking and all spoken audio is combined for each participant to hear through their telephone handset or computer.

Conventional methods of digital audio mixing generally involve superposition. In one such method, temporally synchronized samples of a plurality of digital signals are added arithmetically and the result of the summation forms an output sample. However, this method of signal combination creates distortion ('audio clipping') due to limited dynamic range of sound reproduction devices attempting to reproduce combined signals having large amplitude. Additionally, using a superposition-based signal combiner, the output signal may include a substantial amount of unfiltered noise. For example, an increase in the number of input signals during a conference bridge (i.e., a new caller is added to a conference call) may cause an increase in the amplitude of output samples. Because the additional noise from the additional caller adds to the output signal, even when participants on the call are silent, the total noise heard by the participants is increased. Such cumulative noise creates a significant background "hiss" that is heard by all participants.

To compensate for the above mentioned distortion, various post processing techniques, such as dynamic range compression, automatic gain control, fixed amount of reduction in decibel gain depending on number of channels added, are generally applied to the output signal. Depending upon the complexity of practical implementation, the previously mentioned solutions tend to increase the computational cost, increase hardware cost and are generally ineffective at controlling noise.

Therefore, there is a need for an improved method and apparatus for combining digital signals.

SUMMARY

Embodiments of the present invention comprise a method and apparatus for combining digital signals. In one embodiment, a computer implemented method and an apparatus implementing the method combines a plurality of digital signals. The method determines, within a sample set of the plurality of digital signals, a maximum positive integer value and a maximum negative integer value. The method adds the maximum positive integer value to the maximum negative integer value to form an output value representing a combination of the plurality of digital signals within the sample set. The method repeats the foregoing steps for each additional sample set of digital signals.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
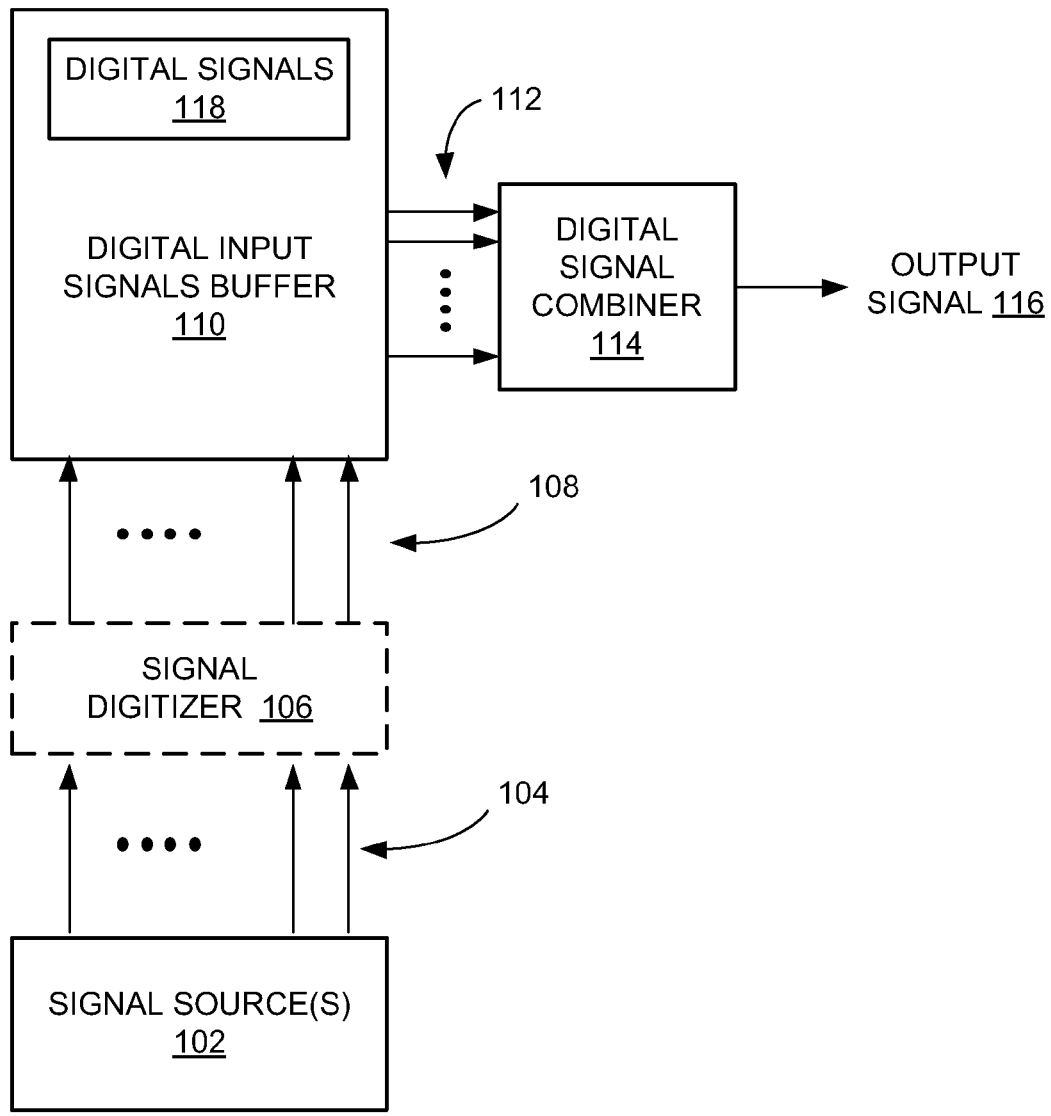
FIG. 1 depicts a block diagram of an apparatus for combining digital signals, according to one or more embodiments.

Various embodiments of a system and method for combining digital signals are described. In the following detailed description, numerous specific details are set forth to provide a thorough understanding of claimed subject matter. However, it will be understood by those skilled in the art that claimed subject matter may be practiced without these specific details. In other instances, methods, apparatuses or systems that would be known by one of ordinary skill have not been described in detail so as not to obscure claimed subject matter.

Some portions of the detailed description which follow are presented in terms of algorithms or symbolic representations of operations on binary digital signals stored within a memory of a specific apparatus or special purpose computing device or platform. In the context of this particular specification, the term specific apparatus or the like includes a general purpose computer once it is programmed to perform particular functions pursuant to instructions from program software. Algorithmic descriptions or symbolic representations are examples of techniques used by those of ordinary skill in the signal processing or related arts to convey the substance of their work to others skilled in the art. An algorithm is here, and is generally, considered to be a self-consistent sequence of operations or similar signal processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these or similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a specific apparatus, such as a special purpose computer or a similar special purpose electronic computing device. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or similar special purpose electronic computing device.

Embodiments of the present invention comprise a method and apparatus for combining a plurality of digital signals, where each digital signal is represented by a sequence of integer values (e.g., a pulse code modulated signal). A sample set is defined as the samples of all the input signals that occur at one instant of time. In one embodiment, for each sample set, samples with a maximum positive value and a maximum negative value within the sample set are summed to form an output sample. As a sequence of sample sets are combined, an output signal is produced. A sequence of the output samples represents a combination of the input signals as an output signal. In this manner, any number of input signals may be combined to form an output signal.

FIG. 1 depicts a block diagram of an apparatus 100 for combining digital signals, according to one or more embodiments. The apparatus 100 combines a plurality of input signals 110 to form an output signal 116. To facilitate signal combination, the apparatus 100 comprises a digital signal combiner 114 that combines digital signals from a signal source(s) 102.

The signal sources 102 provide signals to be combined. If the signals are analog signals, the signals are coupled via path 104 to a signal digitizer 106. If the signals on path 104 are digital, the signal digitizer 106 is not used. The digital signals are coupled via path 108 to a digital input signal buffer 110. Buffering the digital signal 118 ensures that signal samples are temporally synchronized when applied to path 112. Path 112 couples the signals 118 to the digital signal combiner 114.

Figure 5:
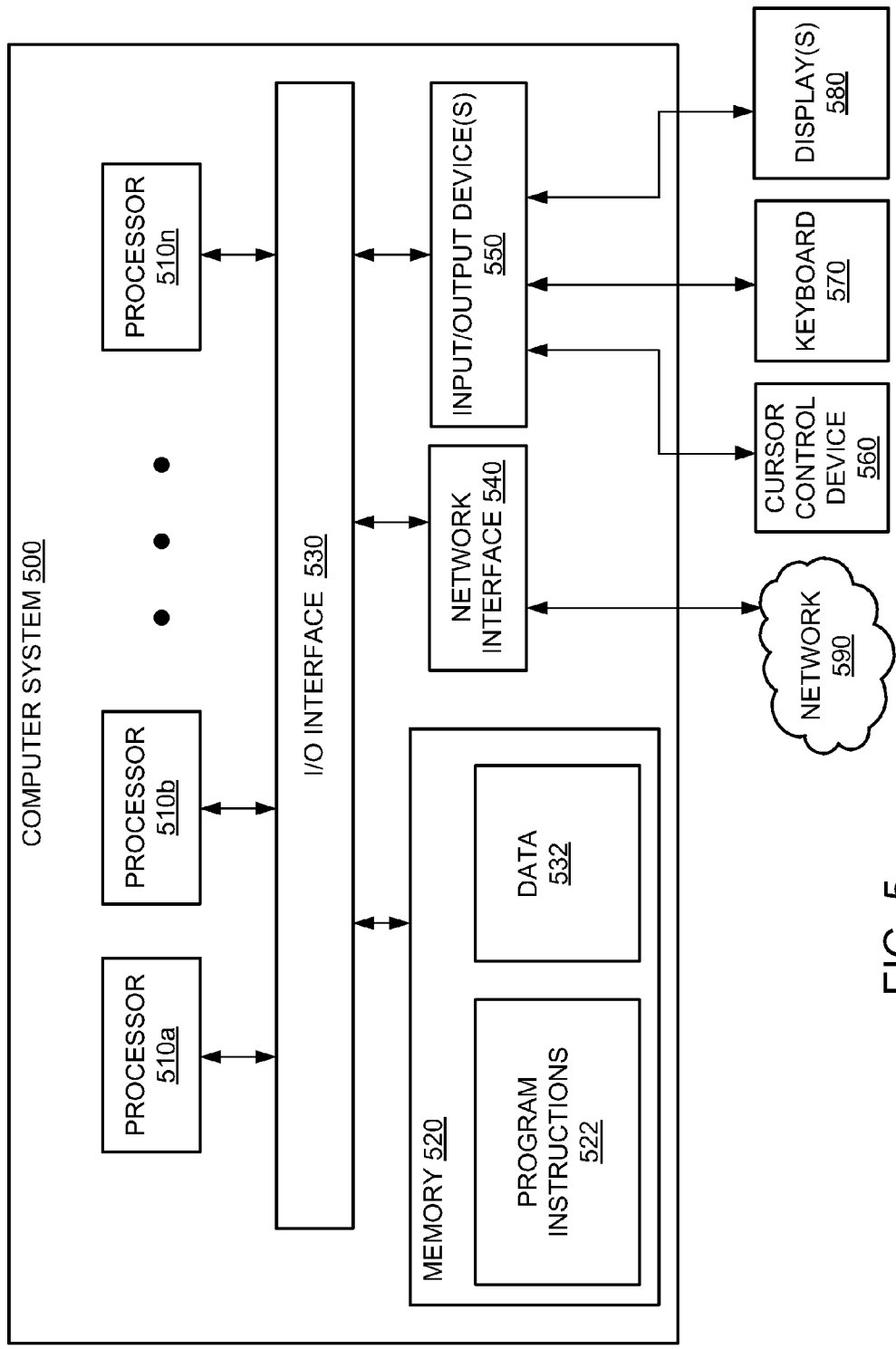
FIG. 5 depicts a computer system that can be used to implement the method of FIG. 2 according to one or more embodiments.

The signal combiner 114 generates an output signal 116 that represents a composite of the digital signals 118. The apparatus 100 may be implemented using a dedicated combiner chip set or as software executing on a computer (see FIG. 5 and related text). As a chip set, the digital signal combiner 114 and buffer 118 may be incorporated into one or more integrated circuits or application specific integrated circuits (ASICs).

According to some embodiments, the signal source(s) 102 are channels from a packet-switched network, such as an Internet Protocol (IP) network, a public switched telephone network (PSTN), or a combination of the two. Moreover, the signal source(s) 102 can be operatively coupled with the system 100 by any communications network, including local area networks (such as Ethernet), private networks, circuit-switched networks and/or the like. In other embodiments, the signal sources 102 may be one or more of a signal recording playback unit, a microphone, signal storage, or combination thereof. A specific embodiment that uses the signal combiner 114 within a web conferencing system is described in detail with respect to FIG. 4.

In one embodiment, the digital signals 118 may be digital audio samples used to represent sound. A sample is a discrete value representing the amplitude of an audio signal at periodic points in time. Linear pulse code modulation (LPCM) is a method of encoding audio information digitally. The term LPCM also refers collectively to formats using this method of encoding. The term pulse code modulation (PCM), though strictly more general, is often used to describe data encoded as LPCM. In LPCM, for example, if the sample is 16-bit signed, the sample range is from −32768 to 32767, with a center point of 0. For example, signed LPCM data is used on Audio CD, DVD Video and/or the like; 16-bit LPCM is used in WAV, audio/L16 and the like. If the sample is 16-bit unsigned, the sample range is from 0 to 65535, with a center point of 32768. Herein, as an exemplary embodiment, PCM and LPCM both refer to 16 bit signed LPCM samples with centre point of 0. Those skilled in the art will realize that other sampling formats may be used with various embodiments of the invention to facilitate signal combination.

According to some embodiments, the digital signal combiner 114 is used to combine a plurality of input signals 118. In one embodiment, the signals being combined are audio signals, e.g., audio mixing. Audio mixing is the process by which multiple live or recorded channels are combined to produce one or more output channels. Typically, in Voice over Internet Protocol (VoIP) communications there is a need to perform audio mixing to provide value added services. Audio conferencing, for example, is one such service that uses audio mixing. Audio conferencing is a telephonic conversation involving a plurality of participating endpoints (participants). In a full duplex conference of n participants, each participant may receive combined sound from all other, (n−1) participants and, in turn, broadcast audio to all other participants. Audio conferences may be implemented at any endpoint or on a dedicated server. In any form of conference, the audio of each participant is combined to enable all participants to hear all other participants. One particular embodiment, web-based conferencing, is described in detail with respect to FIG. 4 below.

Figure 2:
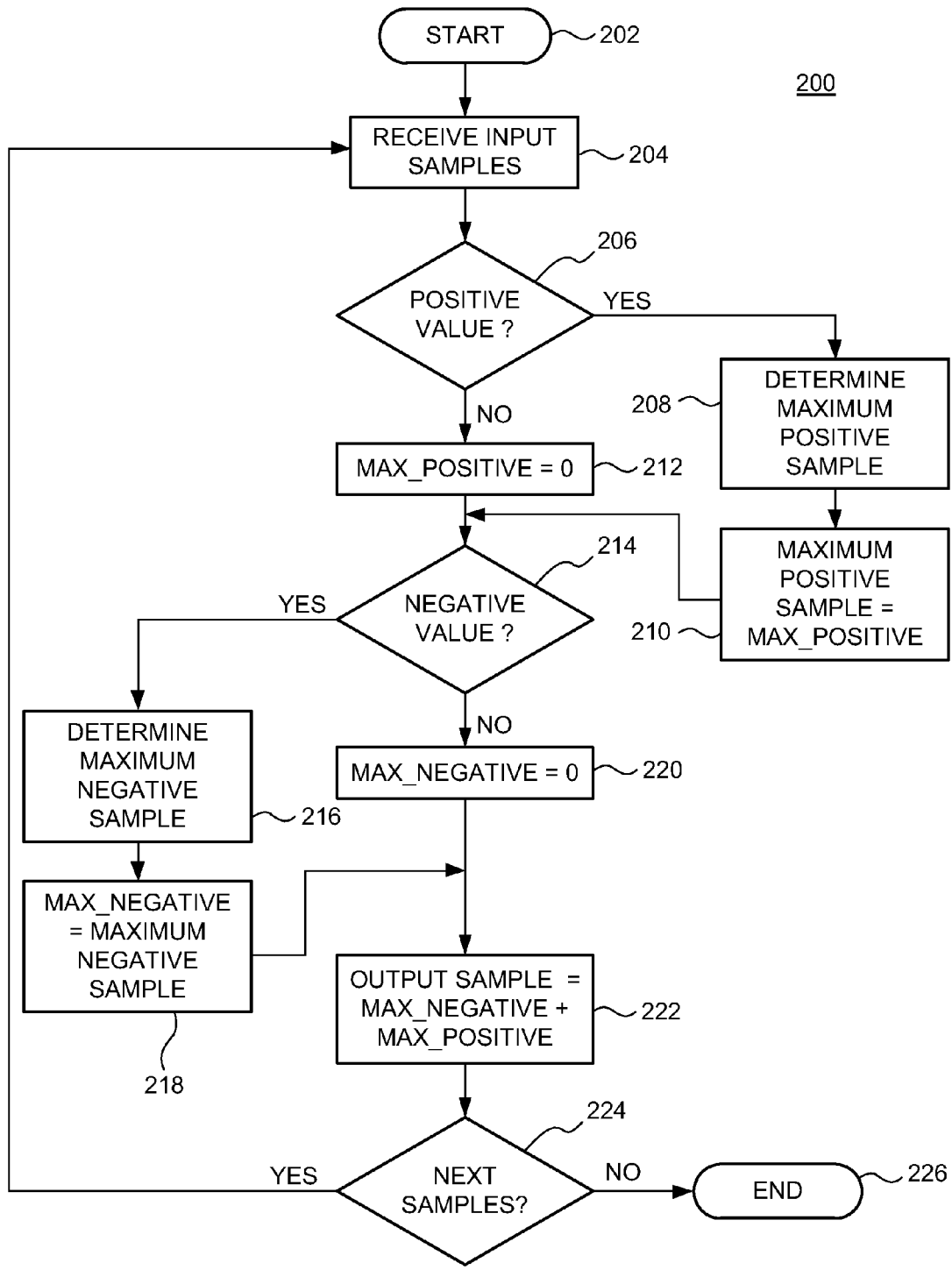
FIG. 2 depicts a flow diagram of a method for combining digital signals as performed by the signal combiner of FIG. 1, according to one or more embodiments.

FIG. 2 depicts a flow diagram of a method 200 illustrating operation of the digital signal combiner 114 of FIG. 1, according to one or more embodiments. If the combiner is implemented in software, then method 200 represents execution of the software using a computer, such as computer system 400 of FIG. 4 according to another embodiment of the invention. The method 200 combines multiple input signals to form a single output signal. In one embodiment, all the input signals are digital, sampled at the same rate and are temporarily synchronous. Further, in one embodiment, the samples are represented in LPCM format. As such, at each periodic sample time (e.g., 8 kHz), all of the samples across all inputs (one sample from each input signal) form a sample set. The method 200 repetitively processes each sample set to combine the sample set to form a single output sample. A sequence of output samples forms the output signal (output signal 116 of FIG. 1).

The method 200 starts at step 202 and proceeds to step 204. At step 204, the method 200 receives input samples. The samples are generally buffered (temporarily stored) in memory while processed. According to some embodiments, the digital signal combiner (e.g., the digital signal combiner 114 of FIG. 1) receives input pulse code modulated (PCM) samples (e.g., the digital signals 118 of FIG. 1). In other embodiments, the signal digitizer (e.g., the signal digitizer 106 of FIG. 1) receives one or more analog signals from the signal source(s) (e.g., the signal source(s) 102 of FIG. 1) and generates pulse code modulated (PCM) samples (e.g., the digital signals 118 of FIG. 1).

At step 206, a determination is made as to whether any of the received input samples have a positive value. If the method 200 determines that at least one received input sample has a positive value (option "YES"), then the method 200 proceeds to step 208. At step 208, the method 200 determines a maximum positive sample by comparing all input samples at the particular point in time represented by the sample set. At step 210, the method 200 stores the maximum positive sample value as a variable. According to some embodiments, the input PCM sample in the sample set with maximum positive value is selected and its value is assigned to a signed integer represented by a variable name, Max_Positive. The method 200 proceeds to step 214.

At step 206, if the method 200 determines that none of the received input samples have a positive value (option "NO"), then the method 200 proceeds to step 212. At step 212, if no input PCM sample has a positive value, a value 0 is assigned to the variable Max_Positive.

At step 214, the method 200 determines whether any of the received input samples have a negative value. If the method 200 determines that at least one received input sample has a negative value (option "YES"), then the method 200 proceeds to step 216. At step 216, the method determines a maximum negative sample within the sample set. At step 218, the method 200 stores the maximum negative sample value as a variable. According to some embodiments, the input PCM sample with maximum negative value in the sample set is selected and its value is assigned to a signed integer represented by a variable name, Max_Negative. The method 200 proceeds to step 222.

At step 214, if the method 200 determines that none of the received input samples have a negative value (option "NO"), then the method 200 proceeds to step 220. At step 220, if no input PCM sample has a negative value, the method 200 assigns a value 0 to the variable, Max_Negative.

At step 222, the method 200 computes an output sample value to represent a combination of all samples in the sample set. The method 200 calculates the arithmetic sum of signed integers Max_Positive and Max_Negative and presents the sum as an output sample. The method 200 proceeds to step 224.

At step 224, the method 200 determines whether there are more input samples for further processing. If it is determined that there are more input samples (option "YES"), then the method 200 proceeds to step 204 to receive the next sample set.

In the embodiment of FIG. 2, steps 206 through 222 process the positive samples first and the negative samples second. In other embodiments, samples may be processed in the opposite order: negative samples first and positive samples second. The order of sample processing is not important to implementing the invention.

In the foregoing embodiments, a maximum positive sample and a maximum negative sample are used in the output sample computation. However, in other embodiments, a maximum positive sample may be used in combination with a negative value that is not the maximum value (e.g., the second largest negative value). In one embodiment, a selection of a non-maximum value occurs when the selected negative value is within a particular range with respect to the maximum positive value (e.g., the difference between the maximum positive value and the selected negative value is not too large). Similarly, in another embodiment, a maximum negative value may be combined any other positive value within a specified range.

At step 224, if it is determined that there are no more input samples for further processing (option "NO"), then the method 200 proceeds to step 226, where the method 200 ends.

After combining, the output signal is transmitted to an end user via computer network, PSTN, SIP network and the like. Transmission techniques and protocols for transmitting digital signals, including digital audio signals through these and other networks are well known in the art.

Using the method 200, any number of channels of input signals may be combined to form the output signal (i.e., the method 200 is scalable). When combining audio signals during a conference call, random background noise does not sum to a level that will cause distortion and participant voices are accurately represented in the output signal. Since the background noise will generally be of a lower signal level, the background noise contribution in the output signal is limited to the noise level of an individual signal source.

Figure 3:
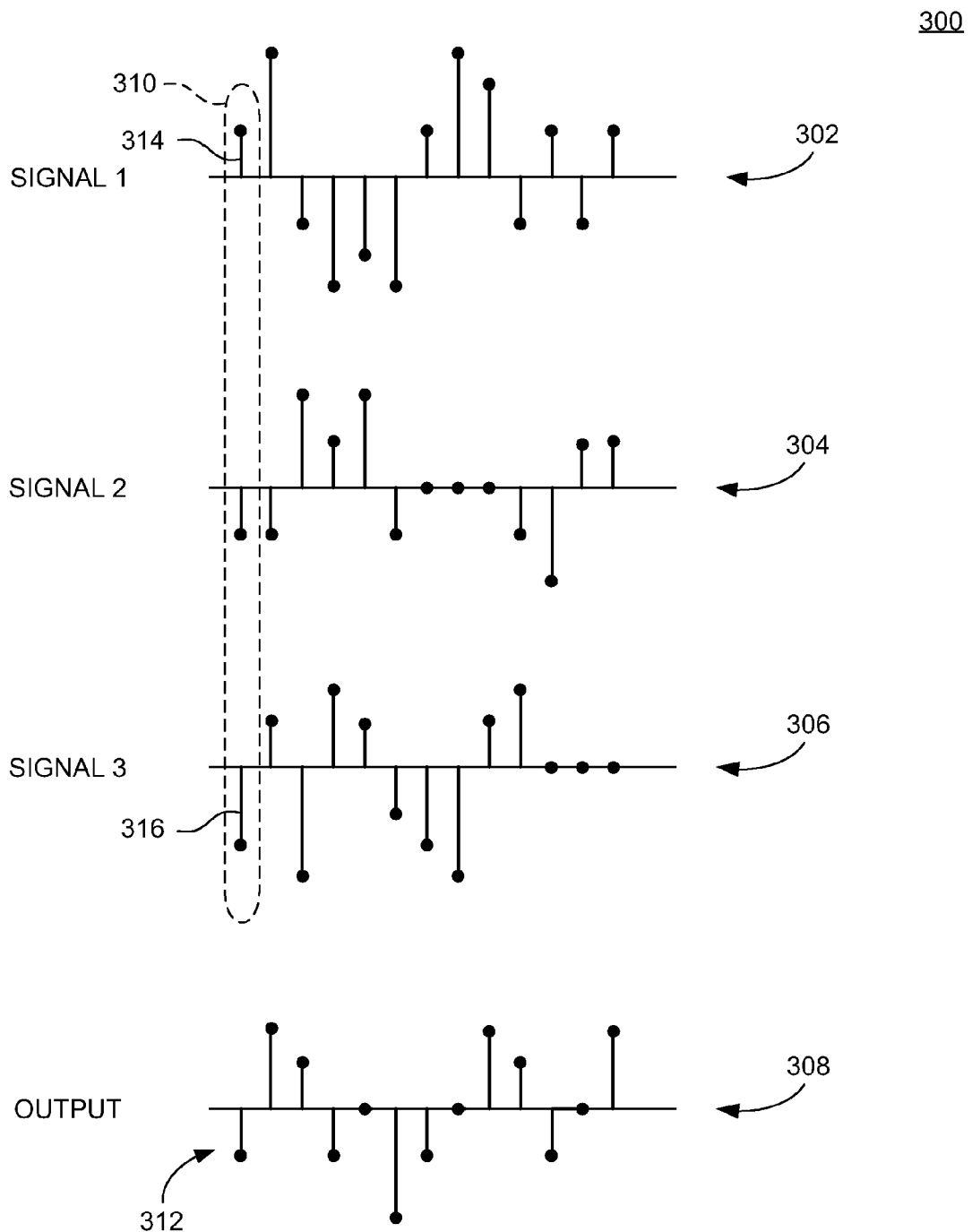
FIG. 3 is an exemplary illustration of combining three input channel signals to generate an output channel signal as performed by the method of FIG. 2, according to one or more embodiments.

FIG. 3 is an exemplary illustration of processing the three input channel signals to generate an output signal, according to one or more embodiments. The signal samples are illustrative and are not to scale. FIG. 3 illustrates three input PCM channel signals, namely Signal 1 (as 302), Signal 2 (as 304) and Signal 3 (as 306) are processed to generate the output signal shown as 308. In one embodiment, the input samples are formed at 8 KHz sampling rate.

A first sample set 310 is received at a first sampling instance. From the sample set 310, a maximum positive sample 314 and a maximum negative sample 316 are identified and then summed to form the output sample 312. This output sample 312 represents a combination of all the samples in the sample set 310. This sample identification and summing process is repeated at each sampling instance to form the output signal 308. The process ensures an intrinsic dynamic range compression resulting in clear audio reproduction (i.e., imperceptible audio distortion) from conventional output devices, e.g., speakers, handset, headphones, and the like.

Figure 4:
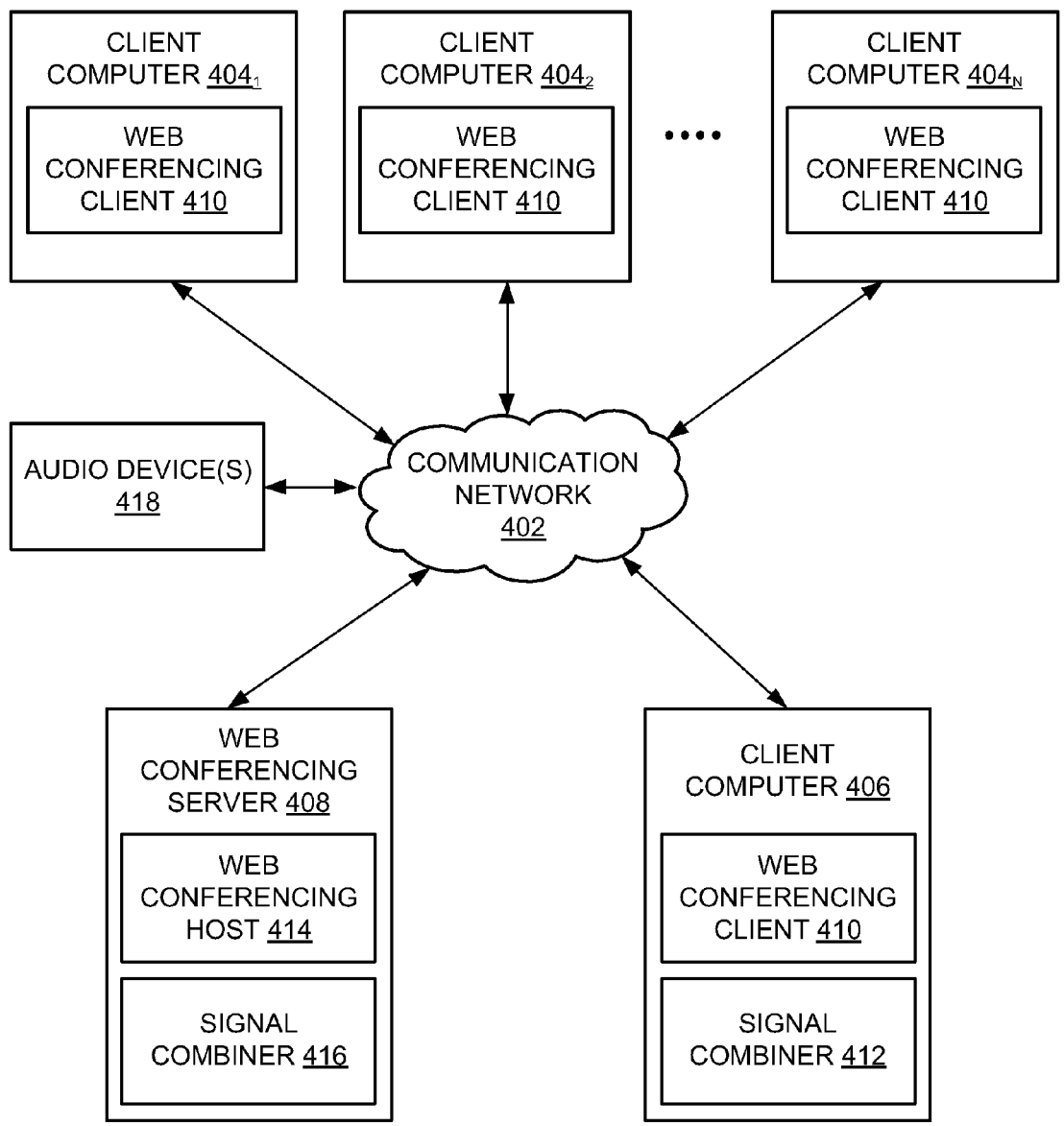
FIG. 4 depicts a block diagram of a web-based conferencing system utilizing the apparatus and method of FIGS. 1 and 2 to combine audio signals in accordance with one or more embodiments of the invention.

FIG. 4 depicts a block diagram of a web-based conferencing system 400 using the signal combiner 412/416 (e.g., digital signal combiner 114 or FIG. 1) in accordance with one embodiment of the invention. For example, ADOBE® CONNECT™ provides web-based conferencing to facilitate multiuser collaboration via chat rooms, audio discussions, presentations, webinars, and the like. In one embodiment, the system 400 comprises a plurality of client computers $404_1$, $404_2$, ... $404_n$ connected to one another and to a web conferencing server via a communications network 402. Each client computer 404 comprises a web conferencing client 410 (e.g., software executing on the client computer to facilitate web-based conferencing). Each client computer 404 participating in a web-based conference forms an audio signal source (e.g., sources 102 in FIG. 1).

The communications network 402 may be any digital network or combination of networks that supports web-based (Internet) communications including, but not limited to, local and/or wide area networks, wireless networks, optical fiber networks, cable networks, and the like.

In one embodiment, the web conferencing server 408 comprises a web conferencing host 414 (e.g., software executing on the client computer to facilitate web-based conferencing) and a signal combiner 416. In this embodiment, the digital signal combiner 416 is used to combine audio signals from client computers 404 coupled to the web conferencing server 408 (e.g., a FLASH® media gateway supporting ADOBE®

CONNECT™). The digital signal combiner 416 combines audio signals received from various participants (e.g., client computers 404) and the web conferencing server 408 facilitates distribution of the combined audio signal to the various participants concurrently participating in the web conference.

In one embodiment, the signal combiner 416 combines the audio (voices) of all N conference participants to form a composite signal (e.g., output signal 116 in FIG. 1). The composite signal is sent to all participant client computers 404. In another embodiment, the signal combiner 416 creates an output for all N conference participants after processing N−1 input signals, excluding the voice of a participant itself, i.e., each participant receives a composite signal containing the voices of all other N−1 participants excluding itself. In this case, the signal combiner 416 is used to generate N composite signals using the "almost" same input—the only variation in the input for each of the N composite outputs being that i-th participant is excluded. In such a specific embodiment, results retrieved from one iteration while determining maximum positive and maximum negative samples for an output combination may be cached to improve the maximum positive and maximum negative sample determination for the rest of combinations of composite output signals. One specific caching solution iterates over the input sample set once and finds two max_positive and two max_negative samples, then reuses this result for faster determination of max_negative/max_positive for individual combinations forming the N combined signals.

Furthermore, the combined audio signal may be distributed by the web conferencing server through call routing to a Public Switched Telephone Network (PSTN) and/or a Session Initiation Protocol (SIP) network. As such, endpoints of the network may comprise mixed technology users (represented as audio devices 418 in FIG. 4) including, conventional telephone handset, cellular telephone, video conference equipment, devices with a FLASH client, and so on. FLASH®, ADOBE®, and ADOBE® CONNECT™ are registered trademarks of Adobe Systems Incorporated.

In an alternative embodiment, one or more of the client computers comprise a signal combiner as represented by client computer 406 comprising signal combiner 412. In this embodiment, the web conferencing server 408 is optional and the client computer 406 combines the audio signals from the other participants (client computers 404) in accordance with the embodiments discussed above and presents the combined audio to the user of the client computer 406. The use of a signal combiner 412 within the client computer 406 facilitates point-to-point conferencing without using a web conferencing server 408.

The embodiments of the present invention may be embodied as methods, apparatus, electronic devices, and/or computer program products. Accordingly, the embodiments of the present invention may be embodied in hardware and/or in software (including firmware, resident software, micro-code, etc.), which may be generally referred to herein as a "circuit" or "module". Furthermore, the present invention may take the form of a computer program product on a computer-usable or computer-readable storage medium having computer-usable or computer-readable program code embodied in the medium for use by or in connection with an instruction execution system. In the context of this document, a computer-usable or computer-readable medium may be any medium that can contain, store, communicate, propagate, or transport the program for use by or in connection with the instruction execution system, apparatus, or device. These computer program instructions may also be stored in a computer-usable or computer-readable memory that may direct a computer or other programmable data processing apparatus to function in a particular manner, such that the instructions stored in the computer usable or computer-readable memory produce an article of manufacture including instructions that implement the function specified in the flowchart and/or block diagram block or blocks.

The computer-usable or computer-readable medium may be, for example but not limited to, an electronic, magnetic, optical, electromagnetic, infrared, or semiconductor system, apparatus, device, or propagation medium. More specific examples (a non exhaustive list) of the computer-readable medium include the following: hard disks, optical storage devices, a transmission media such as those supporting the Internet or an intranet, magnetic storage devices, an electrical connection having one or more wires, a portable computer diskette, a random access memory (RAM), a read-only memory (ROM), an erasable programmable read-only memory (EPROM or Flash memory), an optical fiber, and a compact disc read-only memory (CD-ROM).

Computer program code for carrying out operations of the present invention may be written in an object oriented programming language, such as Java®, Smalltalk or C++, and the like. However, the computer program code for carrying out operations of the present invention may also be written in conventional procedural programming languages, such as the "C" programming language and/or any other lower level assembler languages. It will be further appreciated that the functionality of any or all of the program modules may also be implemented using discrete hardware components, one or more Application Specific Integrated Circuits (ASICs), or programmed Digital Signal Processors or microcontrollers.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the present disclosure and its practical applications, to thereby enable others skilled in the art to best utilize the invention and various embodiments with various modifications as may be suited to the particular use contemplated.

Example Computer System

Various embodiments of method and apparatus for combining digital signals as described herein, may be executed on one or more computer systems, which may interact with various other devices. One such computer system is computer system 500 illustrated by FIG. 5, which may in various embodiments implement any of the elements or functionality illustrated in FIGS. 1, 2, 3 and 4. In various embodiments, computer system 500 may be configured to implement method 200 described above. While the illustrated system demonstrates computer system 500 implementing method 200, computer system 500 may be used to implement any other system, device, element, functionality or method of the above-described embodiments. In the illustrated embodiments, computer system 500 may be configured to implement digital signal combiner 114 as processor-executable program instructions 522 (e.g., program instructions executable by processor(s) 510) in various embodiments.

In the illustrated embodiment, computer system 500 includes one or more processors 510 coupled to a system memory 520 via an input/output (I/O) interface 530. Computer system 500 further includes a network interface 450 coupled to I/O interface 530 and one or more input/output devices 550, such as cursor control device 560, keyboard 570, and display(s) 580. In some cases, it is contemplated that embodiments may be implemented using a single instance of computer system 500, while in other embodiments multiple such systems, or multiple nodes making up computer system 500, may be configured to host different portions or instances of various embodiments. For example, in one embodiment some elements may be implemented via one or more nodes of computer system 500 that are distinct from those nodes implementing other elements. In another example, multiple nodes may implement computer system 500 in a distributed manner.

In different embodiments, computer system 500 may be any of various types of devices, including, but not limited to, a personal computer system, desktop computer, laptop, notebook, or netbook computer, mainframe computer system, handheld computer, workstation, network computer, a camera, a set top box, a mobile device, a consumer device, video game console, handheld video game device, application server, storage device, telephone, video conferencing device, a peripheral device such as a switch, modem, router, or in general any type of computing or electronic device.

In various embodiments, computer system 500 may be a uniprocessor system including one processor 510 or a multiprocessor system including several processors $510_a$, $510_b$, ... $510_n$ (e.g., two, four, eight, or another suitable number). Processors 510 may be any suitable processor capable of executing instructions. For example, in various embodiments processors 510 may be general-purpose or embedded processors implementing any of a variety of instruction set architectures (ISAs), such as the x96, PowerPC, SPARC, or MIPS ISAs, or any other suitable ISA. In multiprocessor systems, each of processors 510 may commonly, but not necessarily, implement the same ISA.

System memory 520 may be configured to store program instructions 522 and/or data 532 accessible by processor 510. In various embodiments, system memory 520 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing any of the elements of the embodiments described above may be stored within system memory 520. In other embodiments, program instructions and/or data may be received, sent or stored upon different types of computer-accessible media or on similar media separate from system memory 520 or computer system 500.

In one embodiment, I/O interface 530 may be configured to coordinate I/O traffic between processor 510, system memory 520, and any peripheral devices in the device, including network interface 450 or other peripheral interfaces, such as input/output devices 550, In some embodiments, I/O interface 530 may perform any necessary protocol, timing or other data transformations to convert data signals from one components (e.g., system memory 520) into a format suitable for use by another component (e.g., processor 510). In some embodiments, I/O interface 530 may include support for devices attached through various types of peripheral buses, such as a variant of the Peripheral Component Interconnect (PCI) bus standard or the Universal Serial Bus (USB) standard, for example. In some embodiments, the function of I/O interface 530 may be split into two or more separate components, such as a north bridge and a south bridge, for example. Also, in some embodiments some or all of the functionality of I/O interface 530, such as an interface to system memory 520, may be incorporated directly into processor 510.

Network interface 450 may be configured to allow data to be exchanged between computer system 500 and other devices attached to a network (e.g., network 590), such as one or more external systems or between nodes of computer system 500. In various embodiments, network 500 may include one or more networks including but not limited to Local Area Networks (LANs) (e.g., an Ethernet or corporate network), Wide Area Networks (WANs) (e.g., the Internet), wireless data networks, some other electronic data network, or some combination thereof. In various embodiments, network interface 450 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol. Digital signals (data 532) to be combined using embodiments of the invention may be transmitted to the computer system 500 via the network 590 and the network interface 450.

Input/output devices 550 may, in some embodiments, include one or more display terminals, keyboards, keypads, touchpads, scanning devices, voice or optical recognition devices, or any other devices suitable for entering or accessing data by one or more computer systems 500. Multiple input/output devices 550 may be present in computer system 500 or may be distributed on various nodes of computer system 500. In some embodiments, similar input/output devices may be separate from computer system 500 and may interact with one or more nodes of computer system 500 through a wired or wireless connection, such as over network interface 450.

In some embodiments, the illustrated computer system may implement any of the methods described above, such as the methods illustrated by the flowchart of FIG. 2. In other embodiments, different elements and data may be included.

Those skilled in the art will appreciate that computer system 500 is merely illustrative and is not intended to limit the scope of embodiments. In particular, the computer system and devices may include any combination of hardware or software that can perform the indicated functions of various embodiments, including computers, network devices, Internet appliances, PDAs, wireless phones, pagers, etc. Computer system 500 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via intercomputer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 500 may be transmitted to computer system 500 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium or via a communication medium. In general, a computer-accessible medium may include a storage medium or memory medium such as magnetic or optical media, e.g., disk or DVD/CD-ROM, volatile or non-volatile media such as RAM (e.g., SDRAM, DDR, RDRAM, SRAM, etc.), ROM, etc.

The methods described herein may be implemented in software, hardware, or a combination thereof, in different embodiments. In addition, the order of methods may be changed, and various elements may be added, reordered, combined, omitted, modified, etc. All examples described herein are presented in a non-limiting manner. Various modifications and changes may be made as would be obvious to a person skilled in the art having benefit of this disclosure. Realizations in accordance with embodiments have been described in the context of particular embodiments. These embodiments are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the example configurations may be implemented as a combined structure or component. These and other variations, modifications, additions, and improvements may fall within the scope of embodiments as defined in the claims that follow.

While the foregoing is directed to embodiments of the present invention, other and further embodiments of the invention may be devised without departing from the basic scope thereof, and the scope thereof is determined by the claims that follow.

Various elements, devices, modules and circuits are described above in association with their respective functions. These elements, devices, modules and circuits are considered means for performing their respective functions as described herein.

While the foregoing is directed to embodiments of the present invention, other and further embodiments of the invention may be devised without departing from the basic scope thereof, and the scope thereof is determined by the claims that follow.

The invention claimed is:

1. A computer implemented method of combining digital signals, where each digital signal is represented by a sequence of values, comprising:
   receiving a plurality of contemporaneous digital audio signals over a period of time;
   calculating, by at least one processor, an output value representing a combination of the plurality of contemporaneous digital audio signals at one instant in time by:
      determining, at the one instant in time, a maximum positive value from the plurality of contemporaneous digital audio signals;
      determining, at the one instant in time, the maximum negative value from the plurality of contemporaneous digital audio signals;
      adding the maximum positive value from the plurality of contemporaneous digital audio signals to the maximum negative value from the plurality of contemporaneous digital audio signals to form the output value representing the combination of the plurality of contemporaneous digital audio signals at the one instant in time; and
   dynamically generating a composite audio signal by combining output values for each instant in time.

2. The method of claim 1, further comprising encoding a plurality of analog audio signals into the plurality of contemporaneous digital audio signals.

3. The method of claim 1, wherein the plurality of contemporaneous digital audio signals are pulse code modulated (PCM) digital signals.

4. The method of claim 1, wherein, if no positive value is determined, setting the maximum positive value to zero or, if no negative value is determined, setting the maximum negative value to zero.

5. The method of claim 1, wherein the plurality of contemporaneous digital audio signals are audio signals from a conference call, where each audio signal represents sound from a participant in the conference call.

6. A computer implemented method for combining audio signals, comprising:
   receiving a plurality of contemporaneous audio signals over a period of time;
   calculating, by at least one processor, output values representing a combination of the plurality of contemporaneous audio signals at various instances in time, by:
      determining a maximum positive value from the plurality of contemporaneous audio signals at each of the various instances in time during the period of time;
      determining a negative value from the plurality of contemporaneous audio signals at each of the various instances in time during the period of time;
      adding the maximum positive value determined for each given instant in time to the negative value determined for the given instant in time to form the output values representing the combination of the plurality of contemporaneous audio signals at the various instances in time; and
   dynamically generating a composite audio signal by combining the output values for each instant in time.

7. The method of claim 6, further comprising buffering the plurality of contemporaneous audio signals.

8. The method of claim 6, further comprising synchronizing the plurality of contemporaneous audio signal.

9. The method of claim 6, wherein the plurality of contemporaneous audio signals are audio signals from a conference call, where each audio signal within the plurality of audio signals represents sound from a participant in the conference call.

10. The method of claim 6, wherein, if no positive value is determined, setting the maximum positive value to zero or, if no negative value is determined, setting the negative value to zero.

11. A computer-readable-storage non-transitory storage medium comprising one or more processor-executable instructions that, when executed by at least one processor, causes the at least one processor to perform a method of combining digital audio signals, where each digital audio signal is represented by a sequence of values, comprising:
   receiving a plurality of contemporaneous digital audio signals over a period of time;
   calculating an output value representing a combination of the plurality of contemporaneous digital audio signals at one instant in time by:
      determining, at the one instant in time, the maximum positive value from the plurality of contemporaneous digital audio signals;

determining, at the one instant in time, the maximum negative value from the plurality of contemporaneous digital audio signals;

adding the maximum positive value from the plurality of contemporaneous digital audio signals to the maximum negative value from the plurality of contemporaneous digital audio signals to form the output value representing the combination of the plurality of contemporaneous digital audio signals at the one instant in time; and dynamically generating a composite audio signal by combining output values for each instant in time.

12. The method of claim 11, further comprising encoding one or more analog audio signals into the plurality of contemporaneous digital audio signals.

13. The method of claim 11, wherein the plurality of contemporaneous digital audio signals are pulse code modulated (PCM) digital signals.

14. The method of claim 11, wherein, if no positive value is determined, setting the positive value to zero or, if no negative value is determined, setting the maximum negative value to zero.

15. The method of claim 11, wherein the plurality of contemporaneous digital audio signals are audio signals from a conference call, where each audio signal represents sound from a participant in the conference call.

16. An apparatus for supporting web-based conferencing comprising:

a web conferencing server, coupled through a communications network to a plurality of client computers operating as a plurality of web conferencing clients, where each web conferencing client in the plurality of web conferencing clients generates a digital audio signal that together form a plurality of contemporaneous digital audio signals from a conference, where the web conferencing server operates as a web conferencing host and receives and combines the plurality of contemporaneous digital audio signals generated by the plurality of web conferencing clients that are participating in the conference by:

determining, at one instant in time, a positive value from the plurality of contemporaneous digital audio signals;

determining, at the one instant in time, a maximum negative value from the plurality of contemporaneous digital audio signals;

adding the positive value from the plurality of contemporaneous digital audio signals to the maximum negative value from the plurality of contemporaneous digital audio signals to form an output value representing a combination of the plurality of contemporaneous digital audio signals at the one instant in time; and dynamically generating a composite audio signal by combining output values for each instant in time.

17. The apparatus of claim 16, wherein the web conferencing server synchronizes the plurality of contemporaneous digital audio signals.

18. The apparatus of claim 16, wherein the web conferencing server combines the digital audio signals from all client computers participating in the conference to form the composite audio except a digital audio signal from a client computer that is to receive the composite audio signal.

19. The method of claim 1, wherein the composite audio signal has an intrinsic dynamic range compression resulting in clear audio reproduction.

20. The method of claim 11, wherein the composite audio signal has an intrinsic dynamic range compression resulting in clear audio reproduction.

* * * * *